United States Patent [19]

Horton et al.

[11] Patent Number: 5,687,078
[45] Date of Patent: Nov. 11, 1997

[54] FINE PITCH BONDING

[75] Inventors: Raymond Robert Horton, Dover Plains; Chandrasekhar Narayan, Hopewell Junction; Michael Jon Palmer, Walden, all of N.Y.

[73] Assignee: International Business Machines Corporation, Armonk, N.Y.

[21] Appl. No.: 476,531

[22] Filed: Jun. 7, 1995

[51] Int. Cl.⁶ .................................................. G01K 7/00
[52] U.S. Cl. ..................... 364/167.01; 364/447.01; 364/477.06; 228/44.3; 228/44.7; 228/49.1; 228/105; 228/179.1; 228/180.1; 228/180.5; 156/64
[58] Field of Search .................... 228/44.3, 44.5, 228/44.7, 49.1, 179.1, 180.1, 180.5, 904, 105; 364/167.01, 477, 477.01, 477.06; 29/729; 156/64

[56] References Cited

U.S. PATENT DOCUMENTS

| | | | |
|---|---|---|---|
| 4,589,584 | 5/1986 | Christiansen et al. | 228/110 |
| 4,912,545 | 3/1990 | Go | 357/67 |
| 5,042,709 | 8/1991 | Cina et al. | 228/105 |
| 5,059,559 | 10/1991 | Takahashi et al. | 437/220 |
| 5,113,565 | 5/1992 | Cipolla et al. | 29/25.01 |
| 5,326,420 | 7/1994 | Vinouze et al. | 156/379 |
| 5,383,118 | 1/1995 | Nguyen | 364/167.01 |
| 5,393,359 | 2/1995 | Chang et al. | 156/64 |

OTHER PUBLICATIONS

O'Mara, W.C., "Active Matrix Liquid Crystal Displays–Part I:Manufacturing Process", Solid State Technology, Dec. 1991, pp. 65–70.

Plach, et al, "Liquid Crystals for Active Matrix Displays", Solid State Technology, Jun. 1992, pp. 186–193.

*Primary Examiner*—Paul P. Gordon
*Assistant Examiner*—Robert J. Dolan
*Attorney, Agent, or Firm*—Daniel P. Morris; Alvin J. Riddles

[57] ABSTRACT

In a bonding station, a tooling principle is provided wherein first and second tool parts respectively hold first and second apparatus parts, each apparatus part having fine conductor periodicity edge bonding regions, in superpositioned registration with the tool parts providing space and accessability for optical alignment and for bonding heat and pressure. The tool members retain a first, position registered, apparatus part, with "X" - "Y" registration capability, in position with an edge bearing a fine conductor periodicity accessable by a tapered edge of the tool which permits optical fine alignment adjustment and bonding heat and pressure application.

10 Claims, 1 Drawing Sheet

FINE PITCH BONDING

FIELD OF THE INVENTION

The invention is in the field of tools for use in the manufacturing of electronic apparatus in sizes that are smaller than the normal positioning tolerances in the art and involving materials that require special flexibility and temperature considerations and in particular to the retention of parts that may have flexibility, in fixed spatial relationship during the formation of bonds at positioning where the pitch is too fine for normal tolerances.

BACKGROUND OF THE INVENTION

In the fabrication of electronic apparatus downsizing efforts have reached a level that parts of the apparatus; that are not rigid, are temperature sensitive and which have connections that are spaced at a pitch so close that the connections are at less than normal positioning tolerances, must be assembled into an overall operational arrangement.

An illustration of such a situation is present in an aspect of the evolving technology of flat panel displays, known in the art as active matrix technology. In the active matrix type technology in essence semiconductor switching and amplification is provided at each pixel of the display raster mounted in an overall translucent assembly arrangement.

An illustration of a manufacturing process in the active matrix technology is described in the technical article titled "Active Matrix Liquid Crystal Displays, Part 1, Manufacturing Process" by William C. O'Mara in the Journal "Solid State Technology", December 1991, Pages 65–70. The liquid crystals themselves and the driving circuits therefor are described in the technical article titled "Liquid Crystals for Active Matrix Displays", by H. Plach et al, in the Journal "Solid State Technology", June 1992, Pages 186–193.

In technologies where there are connections with close periodicity that have to be made to conductors on apparatus parts that have different expansion performance and have different rigidity and flexibility there is a need for tooling that will facilitate the fabrication operations.

SUMMARY OF THE INVENTION

The invention is a tooling principle, tool structure and process wherein, first and second tool members hold a first apparatus part with a fine periodicity conductor pattern with a mating pattern on a second apparatus part in superpositioned registration. The second tool member provides, "X" - "Y" registration capability, and a locating edge for the second apparatus part. The first tool member is retained against the second tool member with a vacuum. The first apparatus part has a fine periodicity conductor region at an edge thereof that is positioned by the first tool member to have an accessible portion extending beyond a tapered edge of the first tool part. The dowel pins extend into registration holes in the second tool part. Heat and bonding pressure and exposure of the regions for optical alignment is made possible by the tapered side of the first tool part. Clearance is provided in the tool part faces for active and passive components mounted on the apparatus parts.

DESCRIPTION OF THE INVENTION

Figure 2:
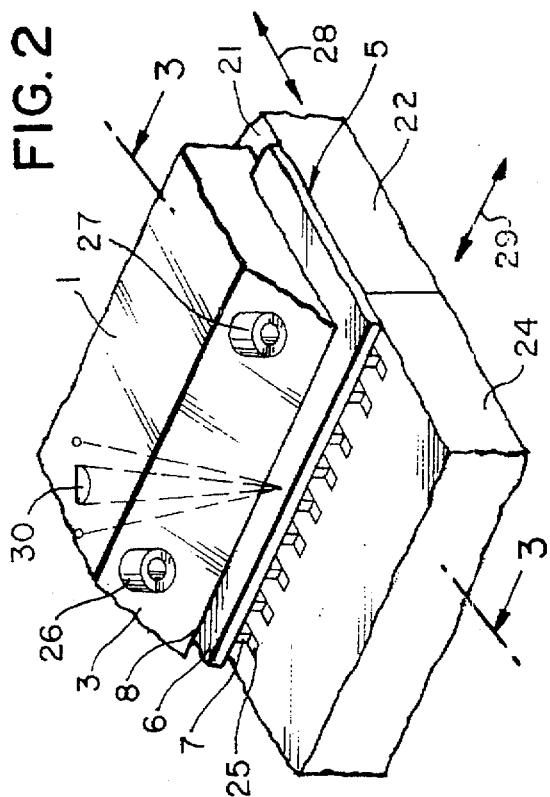
FIG. 2 is a perspective assembly view of the invention.

In forming a bond between conductors on an electronic apparatus being assembled, the pitch or periodicity of the conductor spacing, the relative expansion of the apparatus parts, the force that is involved in the bonding and the relative flexibility of the apparatus parts become active considerations. Frequently the parts of the apparatus are pliable such as the translucent backed flex tape with conductors deposited on it extensively used in the art whereas semiconductor chips equally extensively used in the art for active componentry are relatively rigid. The manufacturing techniques for each type of part can produce extremely fine deposited contacts, so that in making bonding connections of apparatus parts, a situation can occur where connections require optical assistance for alignment, space for the bonding heat and pressure applications must be provided, and differences in expansion of the apparatus parts can affect registration. In the manufacturing techniques, individual members of the fine periodicity contact patterns are frequently bonded together to form electrical contacts between mating members. Those contacts are usually made by the standard techniques in the art of using a heat fusible metal such as solder or a heat and pressure responsive anisotropic conductor film (ACF).

In accordance with the invention when downsizing of apparatus reaches the level where conductor periodicity in a bonding region reaches less than 100 micrometers, normal handling and registration techniques become insufficiently accurate.

In the invention a tooling principle is provided wherein first and second tool parts respectively hold a first apparatus part positioned in registration over a second apparatus part, each apparatus part having a fine periodicity conductor pattern at an edge. The tool parts hold the apparatus parts being bonded in a position with accessible space for optical alignment and bonding. The first apparatus part may be a flex tape with a less than 100 micrometer spacings conductor pattern at an edge thereof and the second apparatus part may be a substrate such as a semiconductor chip with a mating fine periodicity conductor pattern at an edge thereof.

The assembled tool members retain a first, position registered, fine periodicity conductor bearing member with a translucent backing, apparatus part, with "X" - "Y" registration capability, in position with an accessable space of the backing over the conductor pattern exposed. The first tool member has a tapered side and retains the first apparatus part, with dowel pins. The second tool member provides "X"-"Y" registration capability, an edge for locating the second apparatus part with its fine periodicity conductor pattern at that edge and positioned in contact with the conductor pattern of the first apparatus part.

The tapered edge of the first tool member permits optical fine alignment adjustment. The dowel pins of the first tool part extend into registration holes in the second tool part thereby retaining the bonding regions of the first and second apparatus parts in superimposed position for heat and bonding pressure. Where there are components on the apparatus parts clearance is provided in the tool part faces.

Figure 1:
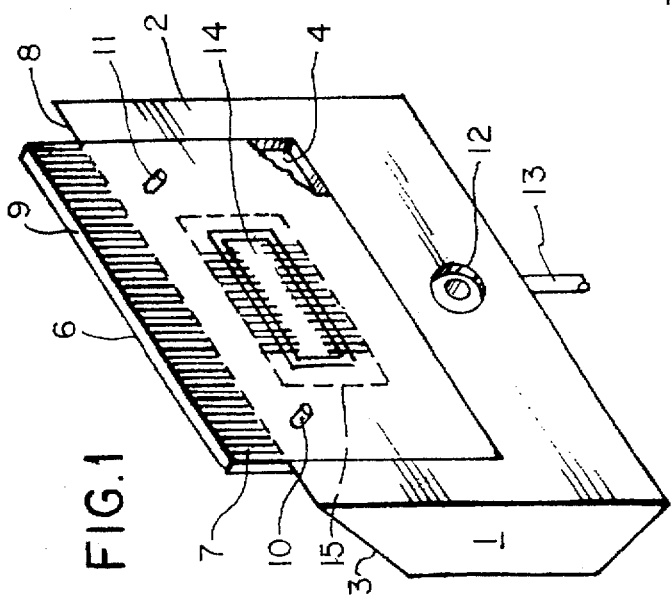
FIG. 1 is a perspective view of one tool part illustrating the registration and retention capability and further illustrating one apparatus part with an exposed edge fine periodicity bonding region.

Referring to FIG. 1 there is shown a perspective view of the first tool part illustrating the registration and retention capability and further illustrating the first apparatus part with the backing of the conductor pattern positioned to be accessable beyond the tapered edge of the first tool part. In FIG. 1, a first tool part 1 has a tool mating face 2 and a tapered side 3. The face 2 has a pocket 4 to accommodate a first translucent backed apparatus part 5 which in turn has a bonding region 6 that has a fine periodicity conductor pattern or contact pattern 7. The pocket 4 is positioned in relation to the size of the apparatus part 5 so that the bonding region 6 of the backing 9 of the part 5 extends adjacent to but beyond the edge 8 of the tapered side 3 and permits movement of the part 5 for fine bonding region 6 contact pattern 7 alignment. Dowel pins illustrated as elements 10 and 11 are provided that locate and retain the part 5 and extend, into second tool part, not visible in this figure. A vacuum port 12, is connected to a standard assembly vacuum level through a pipe 13 connected to a vacuum source not shown. The vacuum holds the tool parts together during assembly. Componentry is depicted as element 14, connected into a wiring pattern, not shown, on apparatus part 5, for which clearance 15, shown dotted, is provided in the first tool part 1 in the area of the pocket 4 under the part 5.

Referring to FIG. 2 there is shown a perspective assembly view of the parts of the bonding station employing the tool principle of the invention with the tool parts superimposed and in position with the conductor patterns to be bonded of the apparatus parts superimposed. In FIG. 2, where like reference numerals are employed as appropriate, a first tool part 1 has located in a pocket 4 thereof, not visible in this Figure, an apparatus part 5 with a portion 6 extending beyond an edge 8 of a tapered side 3. The first tool part 1 is positioned on the face 21 of the second tool part 22. The second tool part 22 has a locating edge 23, against which is placed, the fine periodicity conductor pattern 25 bearing edge of the second apparatus part 24. The pattern 25 in turn is then in contact with the conductor pattern 7 of the first apparatus part. The holes 26 and 27 for dowel pins 10 and 11 extend into accommodating locating holes not visible in this Figure, in the second tool part 22. The tool part 22 is provided with "X"-"Y" movement capability illustrated by double headed arrows labelled 28 and 29 respectively. The tapered side 3 and extension of the bonding region 6 provides space beyond the edge 8 for optical fine alignment of the conductors 7 and 24 in the bonding regions using a lens and ring light source unit standard in the art and depicted as element 30, and space for bonding heat application.

Figure 3:
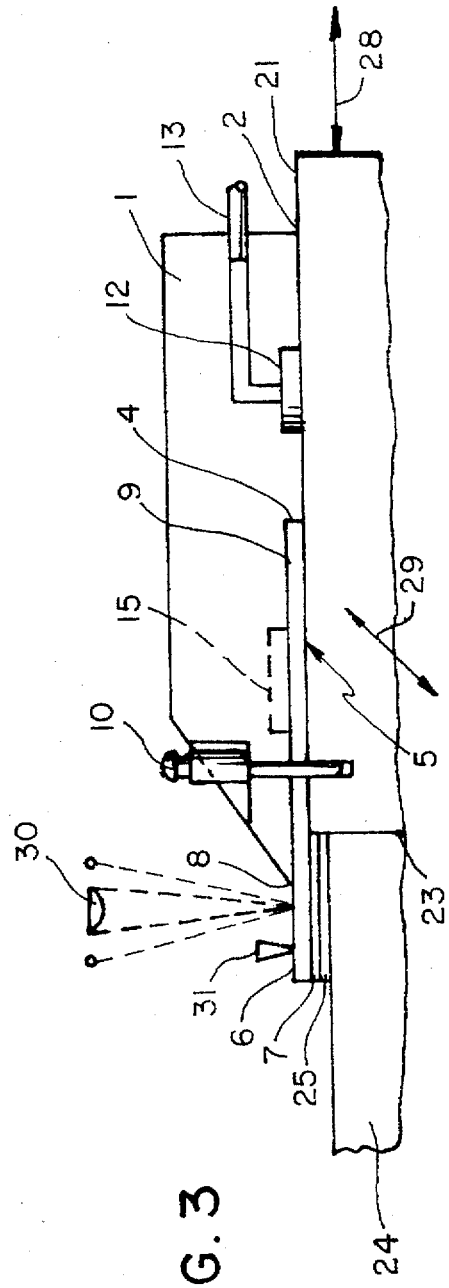
FIG. 3 is a sectional view of the parts of the bonding station employing the tool principle of the invention with the parts superimposed along the line 3—3 of the assembly of FIG. 2 illustrating the relative position of the part retention, the bonding alignment and the bonding heating capability features.

Referring to FIG. 3 there is shown a sectional illustration of the assembled first and second tool parts holding the first apparatus part in position with the second in superimposed relationship for bonding. In FIG. 3 like reference numerals from previous Figures are employed. A heating element 31 applies bonding heat for fusion or ACF connection of the conductors in patterns 7 and 25. The alignment of the conductors in patterns 7 and 25 can be aligned with the "X"-"Y" capability 28, 29 through viewing with the optical element 30 through the translucent backing of the apparatus part 5, or oblique viewing if the backing is not translucent.

In operation the bonding temperature would reach about 200 degrees C. for about 30 seconds in bonding conductors in patterns 7 and 25 on an anisotropic conducting translucent film tape backing having a coefficient of expansion of about 30, and on a silicon crystal substrate part 24 which has a coefficient of expansion of about 3.

What has been described is a tooling principle for bonding very fine periodicity contacts between parts of an apparatus having widely varying properties, wherein differences in expansion and flexibility of the parts to be bonded and the bonding pressure and optical alignment capability are accomodated in the tool parts and their arrangement of the assembly parts.

What is claimed is:

1. In electronic fabrication apparatus, at a location at which first and second apparatus parts each having a fine pitch conductor pattern along an edge are positioned for bonding, the bonding station comprising:

a first tool member having
    a mating face with a first apparatus part locating pocket, so positioned to locate said fine pitch conductor pattern of said first apparatus part at a bonding support space beyond a tapered edge of said first tool member,
    first locating means for establishing the location of a second tool member with respect to said mating face, and
a second tool member having
    positioning means for coordinate movement,
    a second apparatus part locating edge, and,
    second locating means for establishing the location of said second tool member with respect to said first tool member for fine pitch conductor pattern superposition.

2. The bonding station of claim 1 including means for optical alignment of said superimposed fine pitch conductors through said space beyond said tapered edge of said first tool member.

3. The bonding station of claim 1 including means for application of fusing heat to said superimposed fine pitch conductors through said space beyond said tapered edge of said first tool member.

4. The bonding station of claim 3 wherein said first and second locating means are multiple pins extending between said first and second tool parts.

5. The bonding station of claim 4 including vacuum retention means retaining said first and second tool parts.

6. In electronic fabrication apparatus, at a bonding location at which first and second apparatus parts each having an edge region of fine pitch conductors are to be bonded to each other, the improvement comprising:
    a bonding station wherein said edge regions of conductors of said first and second apparatus parts are positioned in an upper and lower part tool, in superimposed relationship with an exposed space adjacent a tapered portion of said upper part of said tool,
    said lower part of said tool having x and y registration movement capability, operable to align said conductors in said first and second apparatus parts, and,
    a bonding treatment applied to said conductors at said exposed space.

7. The bonding station of claim 6 including optical connector alignment in connector patterns.

8. The process of bonding fine pitch connector patterns in connector bonding regions along an edge of each of first and second apparatus parts to be bonded, comprising in combination the steps of:
    providing a bonding station of first and second superimposed tool parks, in which,
        a first apparatus part having a pattern of conductors mounted on a backing and which are to be bonded is positioned in a first of said first and second tool parts with a conductor pattern region of said first apparatus part in a space beyond a tapered edge of said first tool part, and further in which, a second apparatus part with a conductor pattern region is positioned at a locating edge of said second tool part with said conductor pattern regions of said first and said second apparatus parts superimposed, aligning said conductor patterns through x-y registration movement of said second tool part, and, bonding conductors in said conductor patterns of said first and second apparatus parts at said space beyond said tapered edge of said first tool part.

9. The process of claim 8 wherein said alignment is by optical means.

10. The process of claim 9 wherein said applying of at least one of heat and pressure is through said said backing.

* * * * *